(12) United States Patent
Ho et al.

(10) Patent No.: US 8,093,639 B2
(45) Date of Patent: Jan. 10, 2012

(54) METHOD FOR FABRICATING A SEMICONDUCTOR DEVICE

(75) Inventors: Jar-Ming Ho, Taipei (TW); Mao-Ying Wang, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 47 days.

(21) Appl. No.: 12/698,747

(22) Filed: Feb. 2, 2010

(65) Prior Publication Data

US 2010/0133608 A1   Jun. 3, 2010

Related U.S. Application Data

(62) Division of application No. 11/682,176, filed on Mar. 5, 2007, now Pat. No. 7,709,318.

(30) Foreign Application Priority Data

Mar. 9, 2006   (TW) ................................ 95107903 A

(51) Int. Cl.
*H01L 27/108* (2006.01)
*H01L 29/76* (2006.01)
*H01L 29/94* (2006.01)
*H01L 31/119* (2006.01)
*H01L 31/062* (2006.01)
*H01L 31/113* (2006.01)

(52) U.S. Cl. .. 257/296; 257/301; 257/330; 257/E29.262

(58) Field of Classification Search .................. 438/171; 257/296, 301, 330, E29.262

See application file for complete search history.

(56) References Cited

U.S. PATENT DOCUMENTS

| 7,316,952 | B2* | 1/2008 | Lee ................................ 438/243 |
| 7,563,686 | B2* | 7/2009 | Lee et al. ........................ 438/386 |
| 7,700,983 | B2* | 4/2010 | Popp et al. ..................... 257/296 |
| 2006/0223263 | A1* | 10/2006 | Hu ................................. 438/257 |
| 2007/0040202 | A1* | 2/2007 | Enders et al. .................. 257/301 |
| 2008/0032476 | A1* | 2/2008 | Huang et al. ................... 438/259 |

* cited by examiner

*Primary Examiner* — David S Blum

(57) ABSTRACT

An embodiment of the invention provides a method for forming a semiconductor device comprising providing a substrate with a pad layer formed thereon. The pad layer and the substrate are patterned to form a plurality of trenches. A trench top insulating layer is formed in each trench. Wherein the trench top insulating layer protrudes from the substrate and has an extension portion extending to the pad layer. The pad layer and the substrate are etched by using the trench top insulating layers and the extension portions as a mask to form a recess in the substrate. And a recess gate is formed in the recess.

6 Claims, 4 Drawing Sheets

METHOD FOR FABRICATING A SEMICONDUCTOR DEVICE

This application is a divisional of U.S. application Ser. No. 11/682,176, now U.S. Pat. No. 7,709,318, filed Mar. 5, 2007, the entire disclosure of which is hereby incorporated by reference.

BACKGROUND OF THE INVENTION

1. Field of the Invention

The present invention relates in general to methods of fabricating a memory device, and in particular to methods of fabricating a memory device with a recess gate.

2. Description of the Related Art

In the rapidly evolving integrated circuit industry there is a development tendency toward high performance, miniaturization, and high operating speed. Additionally, dynamic random access memory (DRAM) fabrication methods have developed rapidly.

Typically, current dynamic random access memory DRAM cells include a transistor and a capacitor. Since the capacity of current DRAM has reached 512 MB and up to 1 GB, the sizes of memory cells and transistors have been narrowed to meet the demands for high integration, higher memory capacity and higher operating speeds. In conventional planar transistor technology, however, more useable surface area on a chip is required, and it is difficult to meet the previously mentioned demands. Accordingly, recessed gate and channel technology has been applied to DRAM fabrication with the goal of reducing the area occupied by the transistor and the capacitor on the semiconductor substrate. The conventional planar transistor technology requires a large amount of surface area on the chip, and cannot accomplish the demand for high integration. Conversely, the disadvantages of the conventional semiconductor memory cell can be improved by applying recessed vertical gate transistor (RVERT) technology to DRAM fabrication. And the RVERT technology is positioned to become a major semiconductor memory cell fabrication method.

For this reason, Applicant has disclosed the method for fabricating a recessed vertical gate transistor in U.S. patent application Ser. No. 11/145,728 entitled as "A method for forming a semiconductor device". In this patent, Applicant has disclosed that rounded spacers, which are formed from a patterned pad layer and the trench top insulating layer are simultaneously used as a mask for etching the substrate to form a self-aligned recess of a recess gate.

BRIEF SUMMARY OF THE INVENTION

Methods for fabricating a semiconductor device are further provided. An exemplary embodiment of a method for fabricating a semiconductor device comprises forming spacers with straight profile sidewalls and forming an extension portion of a trench top insulating layer to enhance anti-etching ability. According to exemplary embodiments of the invention, a recess, for forming a recess gate, having good profile is thus obtained.

An exemplary embodiment of a method for fabricating a semiconductor device comprises providing a substrate with a pad layer formed thereon; the pad layer and the substrate are patterned to form a plurality of trenches; a trench top insulating layer is formed in each trench. The trench top insulating layer protrudes from the substrate and has an extension portion extending to the pad layer. The pad layer and the substrate are etched by using the trench top insulating layers and the extension portions as a mask to form a recess in the substrate, and a recess gate is formed in the recess.

Another embodiment of a semiconductor device structure comprises a substrate having a plurality of trenches therein; a trench top insulating layer is in each trench and protrudes from the substrate. The trench top insulating layer comprises an extension portion, so that a width of the trench top insulating layer at the extension, portion is larger than a width of the trench. Spacers are disposed on sidewalls of the trench top insulating layers and underlying the extension portions. A recess is provided within the substrate between the spacers of neighboring trenches, and a recess gate is in the recess.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
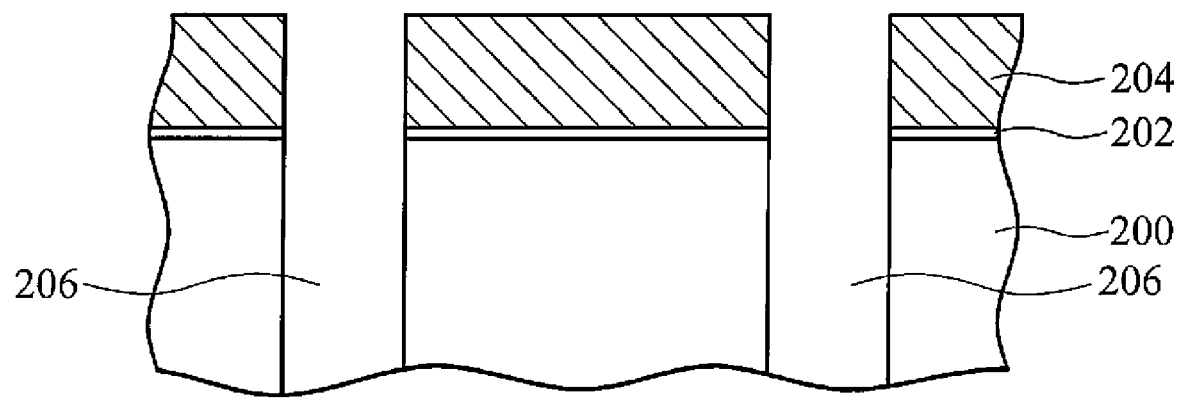
FIGS. 1-7 are schematic views showing an exemplary embodiment of a method for forming a memory with a recessed vertical transistor.

The following description is of the best-contemplated mode of carrying out the invention. This description is made for the purpose of illustrating the general principles of the invention and should not be taken in a limiting sense. The scope of the invention is best determined by reference to the appended claims.

Various embodiments of the invention, which provides a method for forming a semiconductor device, will be described in greater detail by referring to the drawings that accompany the invention. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

FIGS. 1-7 are schematic views showing an exemplary embodiment of a method for forming a memory cell with a recessed vertical transistor. Referring to FIG. 1, a substrate 200 is provided. A first pad layer 202 and a second pad layer 204 are disposed on the substrate 200. The substrate 200 may comprise silicon, gallium arsenide, gallium nitride, strained silicon, silicon germanium, silicon carbide, diamond, an epitaxy layer, and/or other material. The first pad layer 202 may comprise silicon oxide, and the second pad layer 204 may comprise silicon nitride. The first pad layer 202 and the second pad layer 204 are both patterned by lithography and etching processes. The substrate 200 is then etched by using the patterned first pad layer 202 and second pad layer 204 as a mask to form at least two trenches 206, as shown in FIG. 1.

Figure 2:
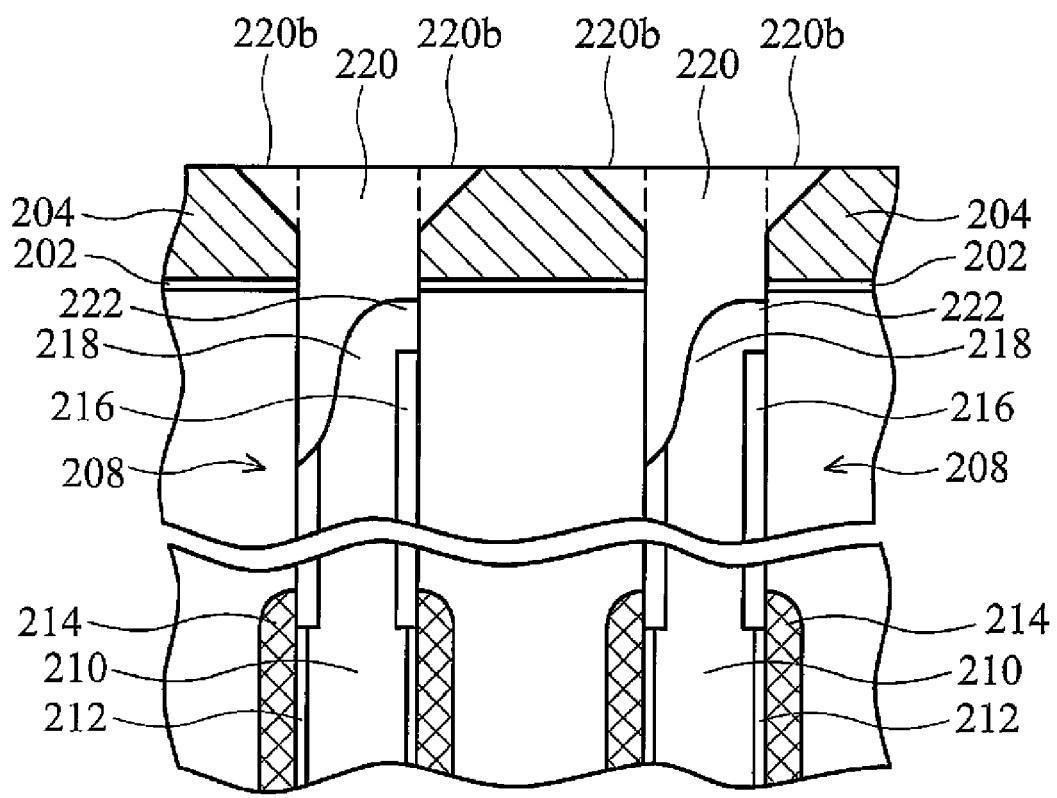

Referring to FIG. 2, deep trench capacitors 208 are formed in the trench 206. The lower portion of the deep trench capacitor 208 may be provided with a top electrode 210, a bottom electrode 214 and a capacitor dielectric layer 212. Preferably, the top electrode 210 comprises polysilicon or other conductive material; the capacitor dielectric layer 212 is silicon oxynitride; and the bottom electrode 214 is a doped region in the substrate 200 adjacent to the lower portion of the trench 206. The upper portion of the deep trench capacitor 208 may be provided with a collar dielectric layer 216 formed on sidewalls of the trench; a conductive layer 218 electrically connecting to the top electrode 210; and trench top insulating layer 220 disposed at the top of the trench 206. The collar dielectric layer 216 may comprise nitride, oxide or other dielectric material. The conductive layer 218 may comprises poly-Si, poly SiGe, metal or other conductive material.

In the preferred embodiment of the invention, the trench top insulating layer 220, which is overlying the deep trench capacitor 208 and protruding from the substrate 200, is formed by a high density plasma chemical vapor deposition (HDPCVD) having a deposition/sputtering ratio of about 3 to 4. One side of the trench top insulating layer 220 in the trench 206 extends to the collar dielectric layer 216, to thus isolate the conductive layer 218 from the substrate 200. Spaces between the other side of the trench top insulating layer 220 in the trench 206 and the collar dielectric layer 216 allow formation of a buried strap 222 for connecting to the substrate 200.

In the preferred embodiment of the invention, the trench top insulating layer 220 further includes an extension portion 220b formed by HDPCVD which enables simultaneous deposition and etching processes. That is, during the HDPCVD process, which has a low deposition/sputtering ratio, the trench top insulating layer 220 is deposited in the trench 206, and a portion of the second pad layer 204 is etched, to then fill with the insulating material. In other words, the second pad layer 204 adjacent to corners of the trench 206 is removed to form the extension portion 220b of the trench top insulating layer 220 on the second pad layer 204. In one example, the thickness of the trench top insulating layer 220 protruding from the substrate 200 is 1.5 times as wide as a minimum line width of a recess gate. For example, while the minimum line width of a recess gate is about 90 nm, the thickness of the trench top insulating layer 220 protruding from the substrate 200 is about 135 nm.

Preferably, the trench top insulating layer 220 comprises a trench top oxide (TTO), such as silicon oxide. The HDPCVD process, which has a deposition/sputtering ratio of about 3 to 4, may include hydrogen ($H_2$) and argon (Ar). Next, a planarization process, such as chemical mechanical planarization (CMP), is performed to remove a part of the trench top insulating layer 220, the extension portion 220b and the second pad layer 204.

Figure 3:
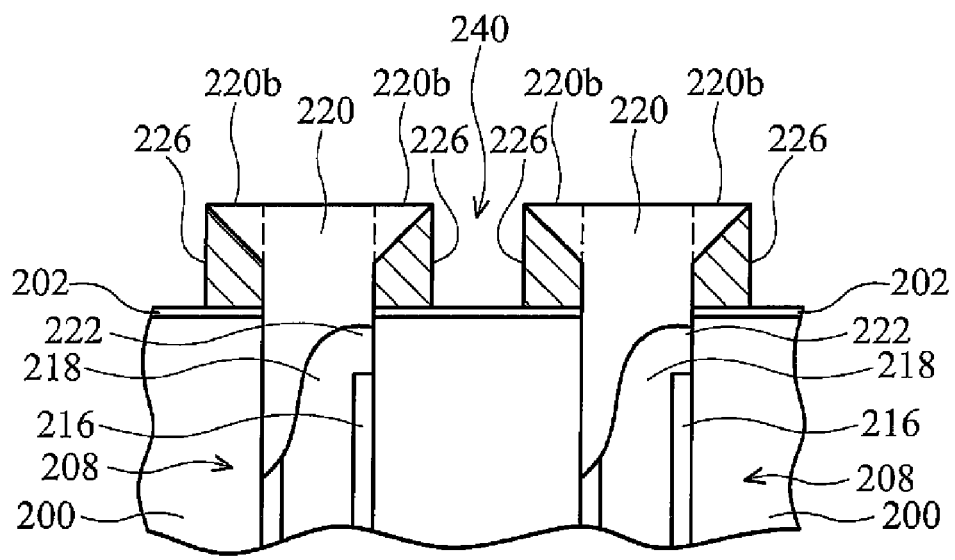

Referring to FIG. 3, the second pad layer 204 is etched by using the trench top insulating layer 220 and its extension portion 220b as a mask. After the etching process, patterned second pad layer 204 is left, hence an opening 240 surrounded by spacers 226 is formed on the substrate 200. In the preferred embodiment of the invention, the outside sidewalls of spacers 226 have a straight profile. The etching process may use plasma etching, such as $CH_3F$ plasma etching. According to the preferred embodiment of the invention, as a result of the extension portion 220b extending to the second pad layer 204, the spacers 226 are prevented from being rounded during the etching process. In one example, the thickness of the trench top insulating layer 220 protruding from the substrate 200 is substantially larger than a minimum line width of a recess gate.

Figure 4:
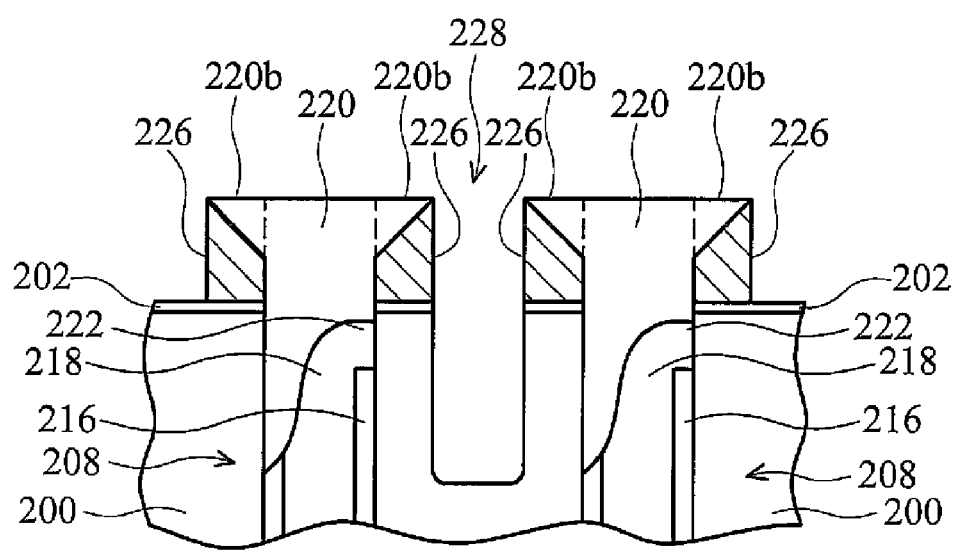

Referring to FIG. 4, the substrate 200 in the opening 240 is etched by using the trench top insulating layer 220, the extension portion 220b and the spacers 226 as a mask. Thus, a recess 228 is formed within the substrate 200. The etching process may use anisotropic etching, such as reactive ion etching (RIE). As in the preferred embodiment of the invention, the trench top insulating layer 220 and its extension portion 220b are formed by the HDPCVD silicon oxide. The HDPCVD silicon oxide has a high etching selectivity with respect to the silicon substrate, thus, a better etching selectivity is achieved. The extension portion 220b on the second pad layer 204, adjacent to corners of the trench 206, also provides protection during the etching process. Therefore, spacer loss during the etching process may be reduced.

Figure 5:
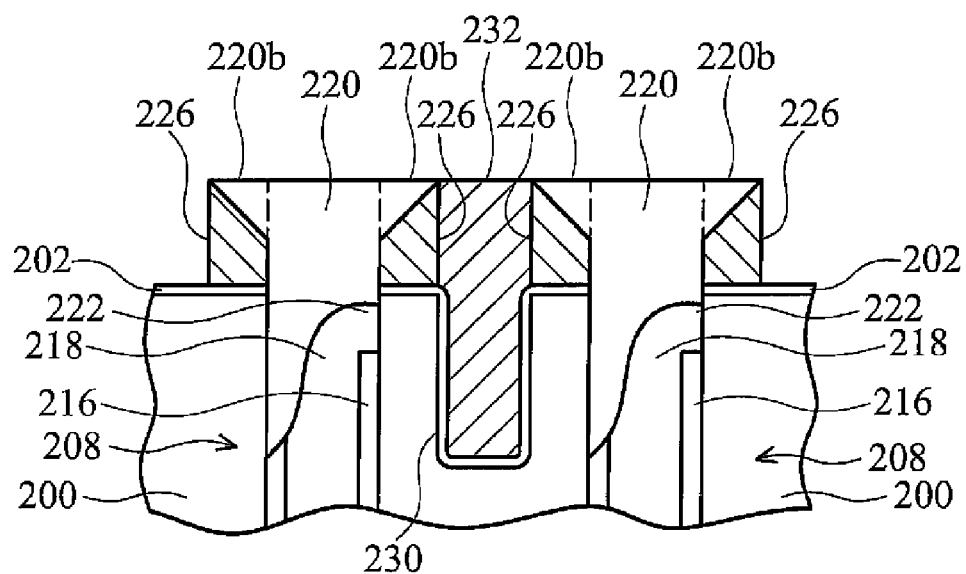

Referring to FIG. 5, next, a recess gate comprising gate dielectric layer 230 and gate conductive layer 232 is formed in the recess 228. The gate dielectric layer 230, preferably of silicon oxide, is formed on the bottom and sidewalls of the recess 228. The gate dielectric layer 230 may be formed by using a thermal process or a deposition process. The thermal process may be rapid thermal oxidation, furnace oxidation or in situ steam generation (ISSG). The deposition method may be low pressure chemical vapor deposition (LPCVD), high temperature oxide (HTP) deposition and the like. Thereafter, a conductive material, such as polysilicon, tungsten, tungsten silicide or the like, is filled into the recess 228 to form the gate conductive layer 232. Preferably, a deposition method, such as low pressure chemical deposition (LPCVD) is used.

As FIG. 5 shows, the trench top insulating layer 220 is formed in the trench and protrudes from the substrate. A width of the trench top insulating layer 220 at the extension portion 220b is larger than a width of the trench as a result of the extension portion 220b. The spacers 226 exist on sidewalls of the trench top insulating layer 220 and underlie the extension portion 220b. The recess gate is formed in the substrate 200 between spacers 226 of neighboring trenches.

Figure 6:
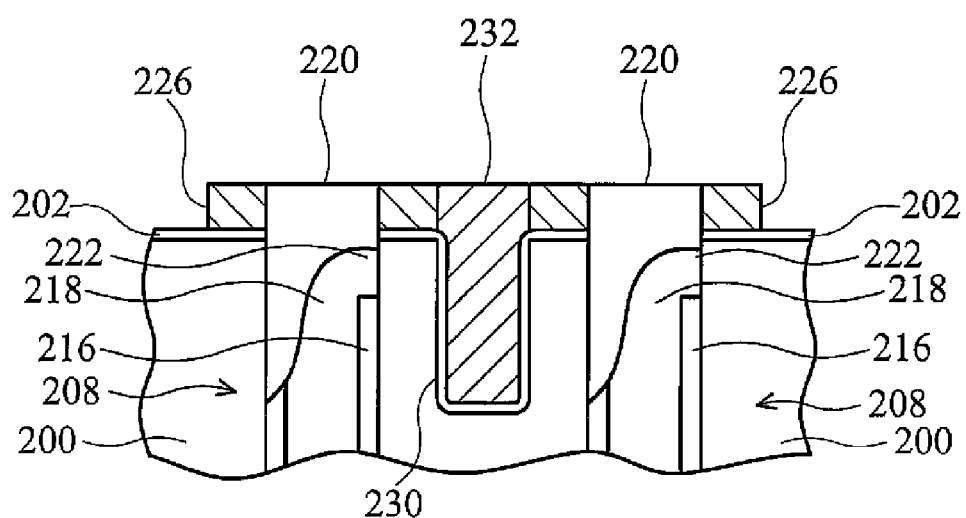

Referring to FIG. 6, the height of the gate conductive layer 232 may lower or equal to the trench top insulating layer 220, a planarization process is then performed. After the planarization process, the extension portion 220b, a portion of the trench top insulating layer 220 and a portion of the spacers 226 are removed.

Figure 7:
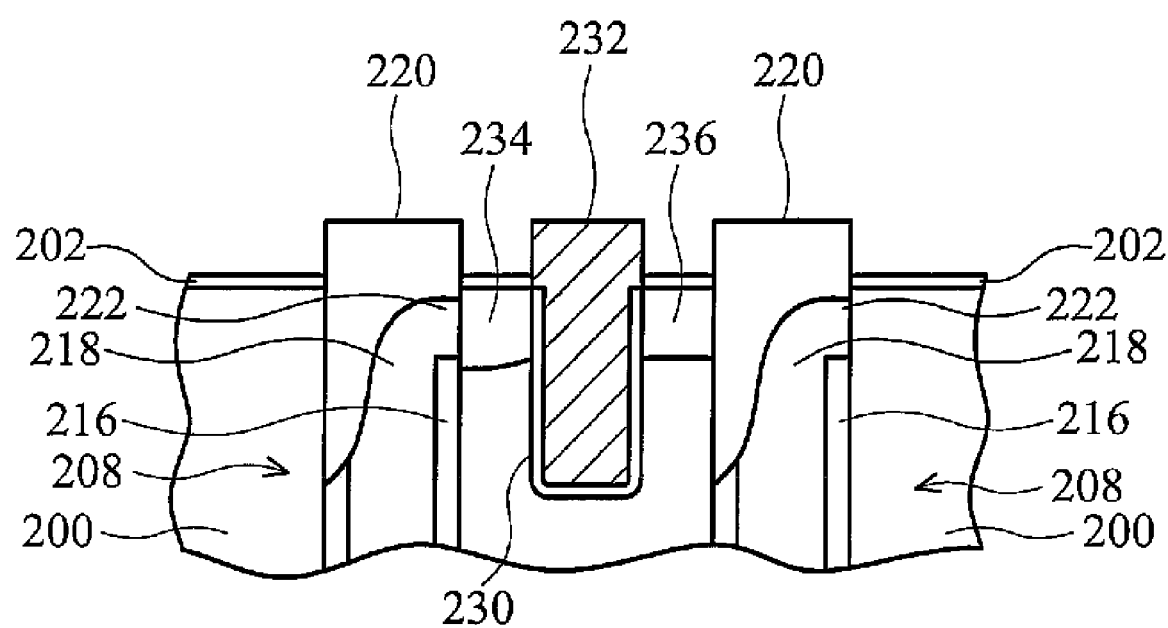

Referring to FIG. 7, next, the left spacers 226 are removed by etching, while the trench top insulating layer 220 and the gate conductive layer 232 are revealed. In the preferred embodiment of the invention, the left spacers are removed by wet etching, such as immersion in phosphoric acid. Thereafter, the substrate 200 is ion implanted to form a source region 234 and a drain region 236 on the opposite side of the recess gate. Wherein the source region 234 electrically connects to the conductive layer 218 of the deep trench capacitor 208 by the buried strap region 222.

As previously embodiments described, spacers 226 are formed from the second pad layer 204. No additional deposition process is required, and the number of process steps is reduced. Moreover, the HDPCVD, which is used to form the trench top insulating layer 220, having a low deposition/sputtering ratio can simultaneously deposit the trench top insulating layer 220 and etch the second pad layer 204. Thus, the extension portion 220b is produced on the second pad layer 204 adjacent to the corners of the trench. Due to the protection provided by the extension portion 220b during an etching process, sidewalls of the spacers 226 can be prevented from being rounded and maintain a straight profile after the etching process. When the spacers 226 having straight profile sidewalls are used as a mask for etching the substrate 200 for forming the recess 228, a tapered recess is not easily produced. Moreover, the HDPCVD has good gap-fill ability for deposition of the trench top insulating material in the trench.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device structure, comprising:
a substrate having a plurality of trenches therein, wherein each trench comprises a capacitor therein;
a trench top insulating layer in each trench and protruding from the substrate, wherein the trench top insulating layer comprises an extension portion wider than the trench, and the extension portion extends over the substrate outside the trench, and a top portion of the extension portion is wider than a bottom portion of the extension portion;
spacers disposed on sidewalls of the trench top insulating layers and underlying the extension portions;
a recess within the substrate between the spacers of neighboring trenches; and
a recess gate in the recess.

2. The semiconductor device structure as claimed in claim 1, wherein the trench top insulating layer and its extension portion are formed by a high density plasma chemical vapor deposition having a deposition/sputtering ratio of about 3 to 4.

3. The semiconductor device structure as claimed in claim 1, wherein the trench top insulating layer comprises silicon oxide.

4. The semiconductor device structure as claimed in claim 1, wherein thickness of the spacer is substantially greater than a minimum line width of the recess gate.

5. The method for forming a semiconductor device as claimed in claim 1, wherein the recess gate protrudes from the substrate.

6. The semiconductor device structure as claimed in claim 1, wherein the recess gate comprises: a gate dielectric layer formed on sidewalls and bottom of the recess; and
a layer of conductive material in the recess.

* * * * *